(12) United States Patent
Harjung

(10) Patent No.: US 7,397,235 B2
(45) Date of Patent: Jul. 8, 2008

(54) PIN ELECTRONIC FOR AUTOMATIC TESTING OF INTEGRATED CIRCUITS

(75) Inventor: Rolf Harjung, Holzgerlingen (DE)

(73) Assignee: Verigy (Singapore) Pte. Ltd., Singapore (SG)

( * ) Notice: Subject to any disclaimer, the term of this patent is extended or adjusted under 35 U.S.C. 154(b) by 152 days.

(21) Appl. No.: 11/365,010

(22) Filed: Mar. 1, 2006

(65) Prior Publication Data

US 2006/0202707 A1  Sep. 14, 2006

(30) Foreign Application Priority Data

Mar. 11, 2005  (EP) .................. 05101915

(51) Int. Cl.
*G01R 31/28* (2006.01)
(52) U.S. Cl. .................. 324/158.1
(58) Field of Classification Search ............. 324/158.1, 324/73.1, 760–765; 714/724–733
See application file for complete search history.

(56) References Cited

U.S. PATENT DOCUMENTS 4,445,111 A * 4/1984 Swift et al. .............. 341/108
5,059,889 A 10/1991 Heaton .................... 323/285
5,773,990 A 6/1998 Wilstrup et al. ........... 324/765
6,275,023 B1 * 8/2001 Oosaki et al. ........... 324/158.1
6,377,065 B1 * 4/2002 Le et al. .................. 324/765
6,750,797 B1 6/2004 Gunther .................. 341/144

FOREIGN PATENT DOCUMENTS

JP  2003 185716  7/2003

OTHER PUBLICATIONS

Abstracts of Japan, Publication No. 2003185716, dated Jul. 3, 2003.
EP Search Report dated Jul. 29, 2005.
EP Office Action dated, Jul. 28, 2006.

* cited by examiner

*Primary Examiner*—Vinh P Nguyen

(57) ABSTRACT

A pin electronic adapted for use in an automatic test equipment for testing integrated circuits ICs includes a driver circuit having an input for receiving an input signal from a data source and an output connected with an input pin of a device under test, and a feedback circuit having at least one input, which receives an input voltage or current at the input pin of the DUT, and an output. The feedback circuit is adapted to provide a voltage in order to force a substantially constant voltage or current at the input pin of the DUT, and a switching device for alternatively connecting the input of the driver circuit with the data source or the output of the feedback circuit.

10 Claims, 4 Drawing Sheets

PIN ELECTRONIC FOR AUTOMATIC TESTING OF INTEGRATED CIRCUITS

CROSS-REFERENCE TO RELATED APPLICATIONS

This application claims priority from European Patent Application No. EP 05101915.6, filed on 11 Mar. 2005.

BACKGROUND ART

The present invention relates to a pin electronic adapted for usage in an automatic test equipment for testing integrated circuits.

Automatic test equipment (ATE) is used for testing electronic components such as integrated circuits (ICs). An IC ATE usually comprises several channels associated with respective pins of a device under test (DUT). A channel includes a pin electronic for generating and measuring signals at the associated pin of the DUT. For the signal generation, each pin electronic comprises a driver circuit capable of generating a digital data stream as determined by a testprocessor connected to the pin electronic. Several channels are usually combined in a so-called channel module which may be mounted on a heat sink or cooled by air in order take away the heat due to the power consumption. Each channel module is connected over an interface circuit for enabling a communication between one or more testprocessors and a computer controlling the ATE.

For performing various measurements of parameters of the DUT such as the input leakage current of an input pin of the DUT, the ATE can also include one or more parametric measurement units (PMU). During a parametric measurement, the pin electronic is switched into a measurement or PMU mode. In the PMU mode, the driver circuit of the pin electronic is disabled and disconnected from the testing input pin of the DUT. Then, the PMU is switched on and connected with the testing input pin, for putting a constant voltage at it or driving a constant current. The PMU measures the current flowing into the testing input pin driven by the constant voltage, or the voltage at the input pin generated by the constant current. The measured current or voltage, respectively, is a parameter for the input leakage or voltage stability of the testing input pin. Parametric measurements require a high degree in accuracy of the voltage or current at an input pin of the DUT. Therefore, each PMU is supplied by an electric power supply separated from the power supply for the driver circuit for generating substantially constant voltages and currents.

DISCLOSURE OF THE INVENTION

It is an object of the present invention to provide an improved pin electronic which is adapted for usage in an automatic test equipment for testing integrated circuits. The object is solved by the independent claim. Preferred embodiments are shown by the dependent claims.

A basic idea of the invention is to force a substantially constant voltage or current at an input pin of a DUT by using a feedback circuit and a driver circuit of a pin electronic. The feedback circuit provides a voltage which is amplified by the driver circuit and then feed to the input pin of the DUT. In contrast to a voltage generated by a PMU, no separate power supply is required. Therefore, the maximum power consumption of the pin electronic may be reduced and kept at a low level. Thus, power variations stay low which increases the temperature stability. This may result in a better measurement accuracy.

According to embodiments of the invention, a pin electronic is provided which is adapted for use in an automatic test equipment—ATE—for testing integrated circuits—ICs—, comprising: a driver circuit having an input for receiving an input signal from a data source and an output connected with an input pin of a device under test—DUT—, a feedback circuit having at least one input, which receives an input voltage or current at the input pin of the DUT, and an output, wherein the feedback circuit is adapted to provide a voltage in order to force a substantially constant voltage or current at the input pin of the DUT, and switching means for alternatively connecting the input of the driver circuit with the data source or the output of the feedback circuit. For example, the switching means may be implemented by transistors, e.g., MOSFETs or Bipolar transistors, in order to improve reliability of the pin electronic and to allow an implementation as integrated circuit.

In an embodiment, the driver circuit comprises a first input for receiving a first voltage V1, a second input for receiving a second voltage V2, and a data input for receiving a digital data stream from a test processor for toggling the output of the driver circuit between the first and second input. The switching means may alternatively connect one of the first or second input of the driver circuit with the first or second voltage V1 or V2, respectively, or with the output of the feedback circuit.

The feedback circuit may be adapted to operate either in a force voltage mode, in which the feedback circuit regulates the voltage at the input pin of the DUT to a substantially constant voltage for measuring an input current into the input pin of the DUT, or in a force current mode, in which the feedback circuit regulates the current flowing into the input pin of the DUT to a substantially constant current for measuring a voltage at the input pin of the DUT.

In a preferred embodiment, the feedback circuit comprises second switching means and a regulator circuit, the output of which is connected to the output of the feedback circuit and the input of which can be connected to either a first control input or a second control input of the feedback circuit by the second switching means. The regulator circuit allows to keep the output voltage of the feedback circuit substantially constant.

Particularly, the regulator circuit may comprise a first amplifier for comparing a voltage received over the second switching means from either the first or second control input with a predefined voltage VSET and generating a control voltage or current at the output of the feedback circuit.

When the feedback circuit is operated in the force current mode, the regulator circuit may be programmable to set a maximum and minimum output voltage of the feedback circuit related to a voltage at the input pin of the DUT in order to limit the output voltage range of the feedback circuit. Thus, the feedback circuit may be adapted to DUTs having different input voltage requirements.

In a preferred embodiment, a resistor may be switched between the output of the driver circuit and the input pin of the DUT, and a second amplifier for amplifying the voltage drop over the resistor may be provided; the output of the second amplifier is connected to the first control input of the feedback circuit. The resistor maps the current flowing into the input pin of the DUT into a voltage which is amplified and may be used as input voltage for the regulator circuit of the feedback circuit in order to keep the current at a substantially constant value.

The feedback circuit may comprise at least two output current ranges, and the driver circuit is used as a buffer for the feedback circuit in the range with the highest output current.

The invention relates according to a further embodiment to a channel board adapted for usage in an automatic test equipment—ATE—for testing integrated circuits—ICs—, comprising for at least one channel a pin electronic of any of the embodiments according to the invention.

The invention relates according to a further embodiment to an automated test equipment—ATE—with a plurality of channels associated with respective pins of a device under test—DUT—, wherein each channel includes a pin electronic of any of the embodiments according to the invention.

According to an embodiment of the invention, a method for performing a parametric measurement at an input pin of a device under test—DUT—with a pin electronic is provided which is adapted for use in an automatic test equipment—ATE—for testing integrated circuits—ICs—, comprising: a driver circuit having an input for receiving an input signal from a data source and an output connected with an input pin of a device under test—DUT—, a feedback circuit having at least one input, which receives an input voltage or current at the input pin of the DUT, and an output, wherein the feedback circuit is adapted to provide a voltage in order to force a substantially constant voltage or current at the input pin of the DUT, and switching means for alternatively connecting the input of the driver circuit with the data source or the output of the feedback circuit, wherein the method comprises the following steps: connecting the input of the driver circuit with the output of the feedback circuit for receiving the voltage provided by the feedback circuit, connecting the output of the driver circuit with the input pin of the DUT for forcing a voltage or current at the input pin of the DUT, and measuring the voltage at the input pin of the DUT or the current flowing into the input pin of the DUT.

The embodiment of the method may further comprise the step of receiving the voltage at the input pin of the DUT or the current flowing into the input pin of the DUT by the feedback circuit and regulating the output voltage of the feedback circuit depending on the received voltage at the input pin of the DUT or the received current flowing into the input pin of the DUT in order to force a substantially constant voltage at the input pin of the DUT or a substantially constant current flowing into the input pin of the DUT.

Embodiments of the invention can be partly or entirely embodied or supported by one or more suitable software programs, which can be stored on or otherwise provided by any kind of data carrier, and which might be executed in or by any suitable data processing unit. Software programs or routines are preferably applied to a computer controlling the pin electronic according to embodiments of the invention.

BRIEF DESCRIPTION OF DRAWINGS

Other objects and many of the attendant advantages of embodiments of the present invention will be readily appreciated and become better understood by reference to the following more detailed description of embodiments in connection with the accompanied drawing(s). Features that are substantially or functionally equal or similar will be referred to by the same reference sign(s).

FIG. 1 shows the circuitry of a pin electronic 10 comprising a driver circuit 12, with a first, second, third input 14, 16, and 18, respectively, and an output 24. The driver circuit 12 is a kind of buffer for isolating its input side from its output side in order to prevent undesirable interaction between the two sides. It is adapted to drive a load such as an input pin 20 of a DUT 22, as shown in FIG. 1. Particularly, the driver circuit 12 amplifies signals at its inputs. In order to be suited for application in an ATE environment, the driver circuit 12 has an output voltage and current range required for stimulating the input pins of different DUTs and to cope with the different input characteristics. The driver circuit may particularly have a high output current capability in order to be able to drive high-speed signals on controlled impedance transmission lines with 50 Ohm characteristic impedance. Due to this, the driver circuit 12 may be also used as a buffer for an output voltage or current used for performing parametric measurements of input pins of a DUT, as will be described in detail in the following. In FIG. 1, the switch of the driver circuit 12 is understood as a buffering switch, i.e., a switch for connecting either one of the inputs 16 and 18 to the output 24 under control of a signal at the input pin 14, and to buffer the input signals at the input pins 16 and 18 in order to isolate the output 24 from the inputs 16 and 18. For example, a voltage source with a weak current driving capability is transformed to a voltage source with a strong current driving capability by the driver circuit 12. Thus, it is possible to perform parametric measurements of input pins of a DUT with a PMU not capable of driving a high output current and to generate a constant output voltage at a low impedance input pin of a DUT.

Figure 1:
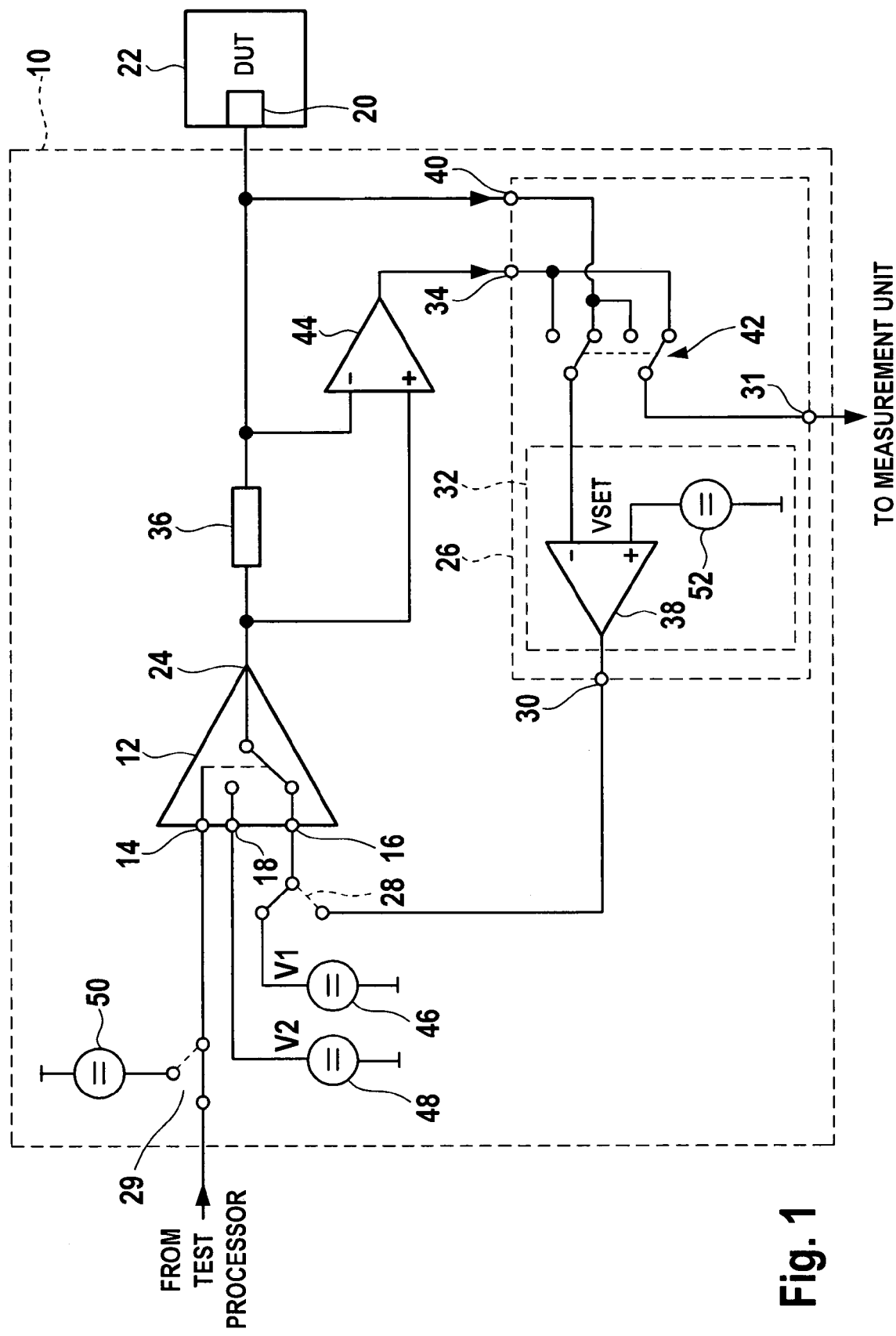
FIG. 1 shows an embodiment of the pin electronic according to the present invention, wherein the pin electronic is operated in a high speed test mode.

The second input 16 can be connected by first switching means 28 with a first voltage source generating a first voltage level V1. The third input 18 is connected with a second voltage source 48 generating a second voltage level V2 which is larger than the first voltage level V1. Both voltage levels V1 and V2 represent voltage levels representing different levels of a stimulation signal for the input pin 20 of the DUT 22.

The first input 14 can be connected by third switching means 29 either with a digital signal, e.g., a data stream, received from a test processor and representing a stimuli pattern for stimulating the input pin 20 of the DUT 22, or with a third voltage source 50 corresponding to a switch signal for toggling the switch of the driver circuit 12 so that the second input 16 is connected to the output 24 in order to route any signal at the second input 16 to the output 24.

The second input 16 can be connected by the first switching means 28 with an output 30 of a feedback circuit 26 contained in the pin electronic 10. It should be noted that instead of the second input 16, also the first input 18 can be connected by the first switching means 28 with the output 30 of the feedback circuit 26. Thus, it is not mandatory to connect the output 30 of the feedback circuit 26 with the low-level input of the driver circuit 12.

The feedback circuit 26 comprises a regulator circuit 32 containing a first amplifier 38 and a fourth voltage source 52 generating a predefined voltage level VSET and connected to the positive input of the first amplifier 38 for regulating the voltage or current at the output 30 of the feedback circuit 26. The voltage level VSET defines a voltage (in a forced voltage mode, refer to the following description) or a current (in a forced current mode, refer to the following description) forced by the feedback circuit 26. The negative input of the first amplifier 38 can be connected by second switching means 42 either with a first control input 34 or a second control input 40 of the feedback circuit 26. The first control input 34 is connected to the output of a second amplifier 44, which may also be part of a PMU, and which amplifies a voltage drop over a resistor 36 connected between the output 24 of the driver circuit 12 and the input pin 20 of the DUT 22. The second control input 40 is directly connected with the input pin 20 of the DUT 22. The second switching means 42 are adapted to connect in a first position the second control input 40 with the negative input of the first amplifier 38 and the first control input 34 with a measurement output 31 of the feedback circuit 26 connectable to equipment for measuring a voltage (not shown) at the output 31. The measured voltage is either the voltage at the input pin 20 of the DUT 22, or the amplified voltage drop over the resistor 36. In the latter case, the measuring voltage at output 31 corresponds to a current flowing into the input pin 20 of the DUT 22. In a second switching position, the second switching means 42 connect the second control input 40 with the measurement output 31 and the first control input 34 with the negative input of the first amplifier 38.

In the following, the functionality of the pin electronic 10 of FIG. 1 is described in detail.

The pin electronic 10 can be operated in three different modes. In a first or high speed mode, the pin electronic 10 receives an input signal in the form of a data stream from a test processor (not shown in FIG. 1) for stimulating the input pin 20 of a DUT 22. This is the test mode, in which a digital input pin of the DUT 22 is stimulated by a certain pattern generated by the test processor. In this mode, values received at certain output or input/output pins of the DUT 22 are compared by the an ATE with expected values in order to test the DUT 22 for a correct functional behavior. In the high speed or test mode, the feedback circuit 26 is inactive and, therefore, the first switching means 28 connect the second input 16 of the driver circuit 12 with the first voltage source. Furthermore, the first input 14 of the driver circuit 12 is connected by the third switching means 29 with the stimuli signal or data stream, respectively, from the test processor.

Figure 2:
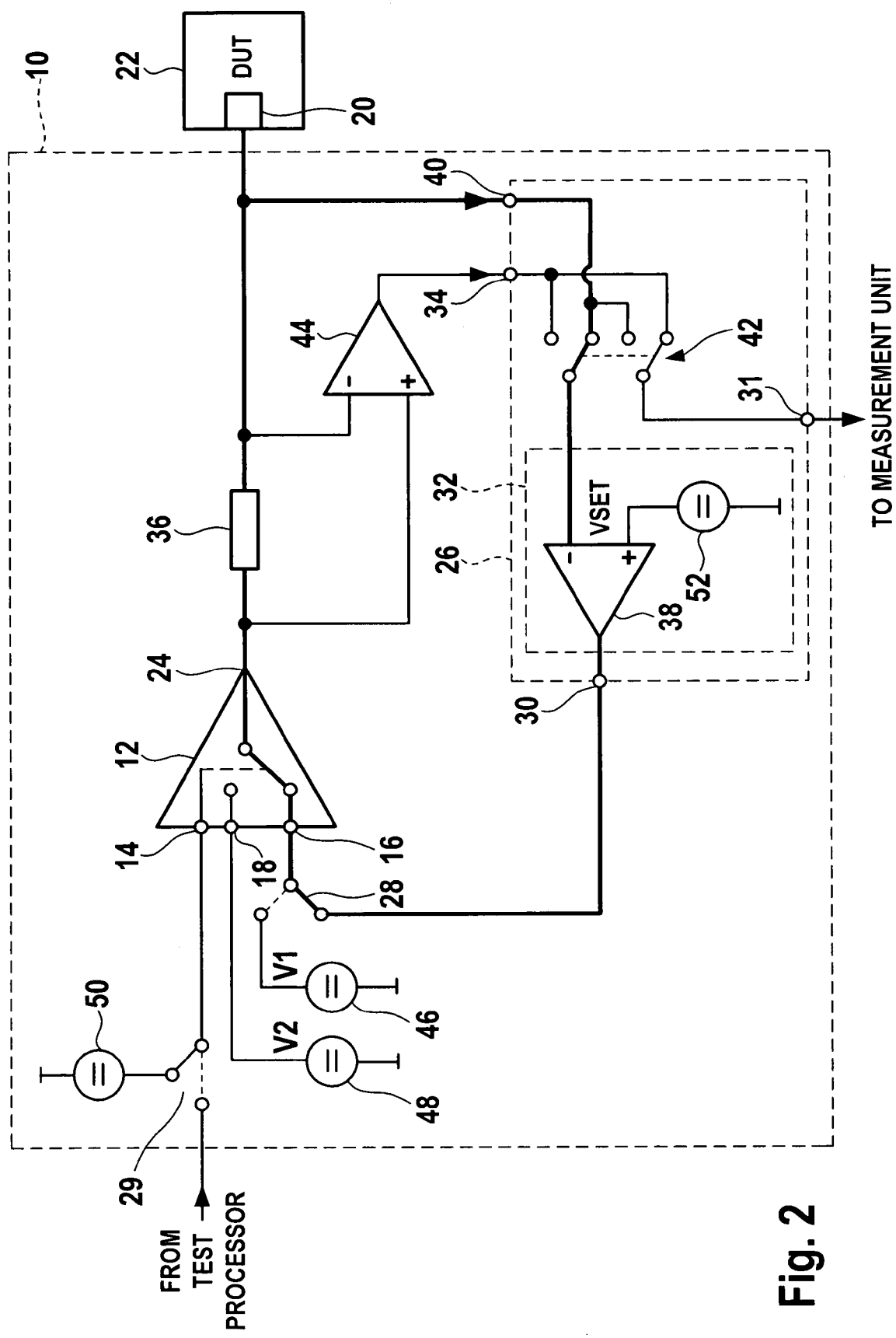
FIG. 2 shows the pin electronic of FIG. 1 operated in a force voltage mode.

In a second mode called the force voltage mode, which is shown in FIG. 2, the driver circuit 12 is used as voltage buffer for the feedback circuit 26. This mode is a measurement mode in which the feedback circuit 26 is active. The first switching means 28 connect the output 30 of the PMU 26 to the second input 16 of the driver circuit 12. The first input 14 of the driver circuit 12 is connected by the third switching means 29 to the third voltage source 50 so that the driver circuit 12 buffers the voltage at the second input 16. Thus, the voltage at the output 30 of the feedback circuit 26 is buffered to the input pin 20 of the DUT 22. Over the second control input 40 and the second switching means 42, the voltage at the input pin 20 of the DUT 22 is fed to the negative input of the first amplifier 38 implementing a feedback in order to keep the voltage at the input pin 20 of the DUT 22 at a nearly constant value. The voltage at the output 30 of the feedback circuit 26 depends on the voltage drop over the resistor 36. The feedback loop implemented in this mode is emphasized in FIG. 2 by the bold line. In this mode, the regulator circuit 32 forces the voltage at the input pin 20 of the DUT 22 to a substantially constant voltage. This allows measurements of the input current, particularly the input leakage current into the input pin 20 of the DUT 22. This input current generates a voltage drop over the resistor 36. The voltage drop is amplified by the second amplifier 44 and fed to the measurement output 31 of the feedback circuit 26 over the second switching means 42.

Figure 3:
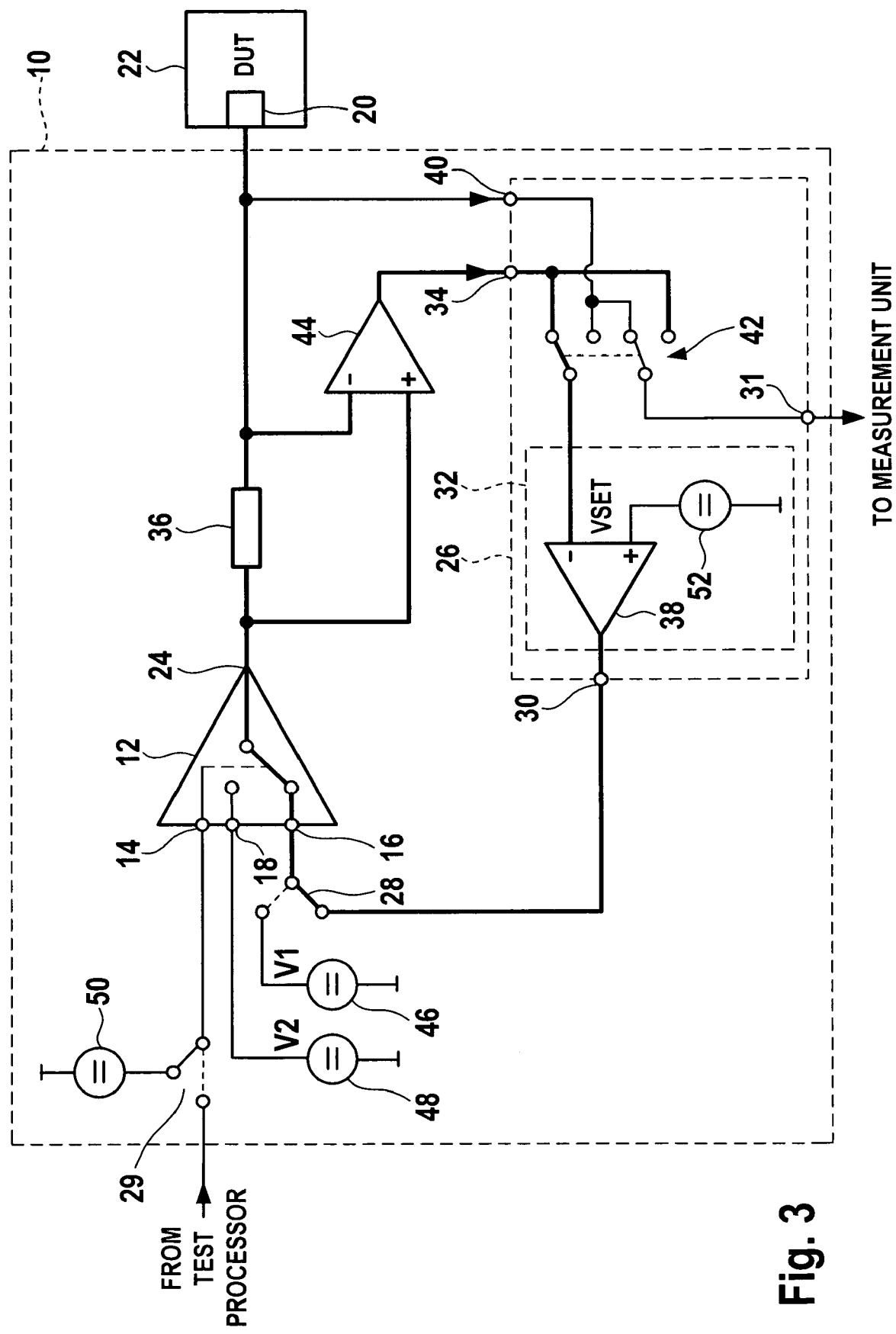
FIG. 3 shows the pin electronic of FIG. 1 operated in a force current mode.

The third mode called force current mode of the pin electronic 10 will now be described with reference to FIG. 3. Also, this mode is a measurement mode in which the feedback circuit 26 is active. In this mode, the second switching means 42 are toggled in contrast to the modes shown in FIGS. 1 and 2, so that the voltage at the output of the second amplifier 44 is fed to the negative input of the first amplifier 38 forcing the feedback circuit 26 to generate a substantially constant current flowing through the resistor 36 into the input pin 20 of the DUT 22. Again, the bold line emphasizes the implemented feedback loop. In this mode, the voltage at the input pin 20 of the DUT 22 can be measured. Therefore, the voltage at the input pin 20 is fed over the second switching means 42 to the measurement output 31 of the feedback circuit 26.

It should be noted that in both measurement modes the feedback circuit may have several different output current ranges. Preferably, the driver circuit 12 is used as a buffer in the range of the feedback circuit with the highest output current. According to this, the power consumption of the feedback circuit 26 is lower than without using the driver circuit 12 as buffer. Particularly, the feedback circuit 26 does not require output drivers capable of driving high currents as required for parametric measurements in the highest current range. Also, by implementing a feedback in both measurement modes, the power consumption and power variation causing temperature fluctuations of the feedback circuit can be significantly reduced by using the driver circuit of the pin electronic as a buffer in the highest output current range. This allows an implementation of the pin electronic 10 or at least parts of it in an integrated circuit.

Figure 4:
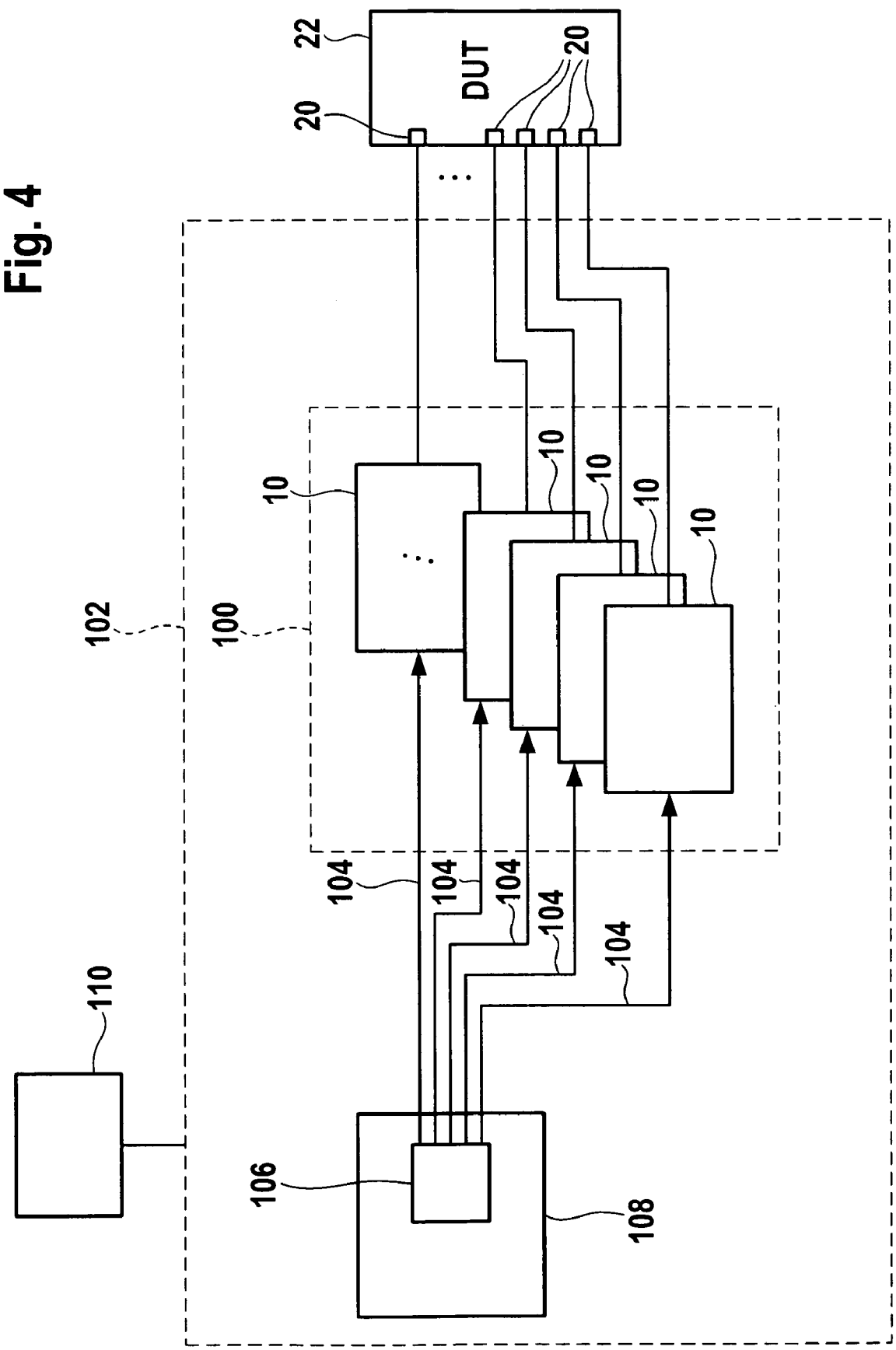
FIG. 4 shows an embodiment of an ATE according to the present invention comprising an embodiment of the pin electronic according to the invention.

FIG. 4 shows an ATE 102 with several channels 104 for testing several pins 20 of a DUT 22. The ATE 102 comprises one or more channel boards 100 containing a plurality of pin electronics 10. For example, the channel board may comprise 64 digital ATE channels which are partitioned to 8 channel modules. Four of the channel modules are mounted on each of the two opposite surfaces of a heat sink in order to efficiently cool the pin electronics. Each channel module may have a connection to an interface module that enables the communication between testprocessors which are part of the channel board and the computer controlling the ATE. A relay module on the opposite end of the channel module routes pinlines of the ATE to a cable assembly ending in spring contacts for the DUT board.

As shown in FIG. 4, a pin electronic 10 is provided for each pin 20 of the DUT 22, which is to be tested. The pin electronics 10 of the channel board 100 receive stimuli and control signals over channel interfaces from test processors controlled by a controller 108 which may be a workstation that is sending data to and receiving data from the testprocessors over an interface card 106 connecting the controller 108 over a cabling 104 with the pin electronics 10. The controller 108 is a central data processing unit of the ATE 102 which is interfacing with the testprocessors which control generation of stimuli and control signals. The controller 108 may be controlled by a GUI (graphical user interface) displayed on a display 110 connected to the ATE 102.

The controller 108 also contains software adapted for controlling the different modes of the pin electronics 10 and described above. Particularly, the controller 108 can be programmed by the software in order to perform test sequences such as switching the pin electronics 10 in the test mode, stimulating the input pins 20 of the DUT 22 and receiving the signals at the output pins of the DUT 22, comparing the received signals with expected values in order to test for a correct functionality of the DUT 22. Furthermore, test computer 108 can switch the pin electronics 10 into the measurements modes described above and perform parametric measurements of the DUT 22.

The invention claimed is:

1. A pin electronic adapted for use in an automatic test equipment—ATE—for testing integrated circuits—ICs—, comprising:
 a driver circuit having a first input for receiving an input signal from a data source and an output connected with an input pin of a device under test—DUT—,
 a feedback circuit having at least one input, which receives an input voltage or current at the input pin of the DUT, and an output, wherein the feedback circuit is adapted to provide a voltage in order to force a substantially constant voltage or current at the input pin of the DUT, and
 first switching means for alternatively providing a second input of the driver circuit with a first voltage V1 or with the output of the feedback circuit.

2. The pin electronic of claim 1, wherein the driver circuit comprises a third input for receiving a second voltage V2, the first input is a data input for receiving a digital data stream from a test processor for toggling the output of the driver circuit between the second and third input, and wherein the first switching means alternatively connect one of the second or third input of the driver circuit with the first or second voltage V1 or V2, respectively, or to the output of the feedback circuit.

3. The pin electronic of claim 1, wherein the feedback circuit is adapted to operate either
 in a force voltage mode, in which the feedback circuit regulates the voltage at the input pin of the DUT to a substantially constant voltage for measuring an input current into the input pin of the DUT or in a force current mode, in which the feedback circuit regulates the current flowing into the input pin of the DUT to a nearly constant current for measuring a voltage at the input pin of the DUT.

4. The pin electronic of claim 3, wherein the at least one input of the feedback circuit comprises a first control input connected to an output of a first amplifier amplifying a voltage drop across a resistor connected between the output of the driver circuit and the input pin of the DUT, a second control input directly connected to the input pin of the DUT, second switching means and a regulator circuit, the output of the regulator circuit is connected to the output of the feedback circuit and the input of the regulator circuit can be connected to either the first control input or the second control input of the feedback circuit by the second switching means.

5. The pin electronic of claim 4, wherein the regulator circuit comprises a second amplifier for comparing a voltage received over the second switching means from either the first or second control input with a predefined voltage VSET and generating a control voltage or current at the output of the feedback circuit.

6. The pin electronic of claim 4, wherein, when the feedback circuit is operated in the force current mode, the regulator circuit is programmable to set a maximum and minimum output voltage of the feedback circuit related to a voltage at the input pin of the DUT in order to limit the output voltage range of the feedback circuit.

7. The pin electronic of claim 1, wherein the feedback circuit comprises at least two output current ranges and the driver circuit is used as a buffer for the feedback circuit in the range with the highest output current.

8. An automated test equipment—ATE—with a plurality of channels associated with respective pins of a device under test—DUT—, wherein each channel includes a pin electronic of claim 1.

9. A method for performing a parametric measurement at an input pin of a device under test—DUT—with a pin electronic adapted for use in an automatic test equipment—ATE—for testing integrated circuits—ICs—, comprising
 a driver circuit having a first input for receiving an input signal from a data source and an output connected with an input pin of a device under test—DUT—,
 a feedback circuit having at least one input, which receives an input voltage or current at the input pin of the DUT, and an output, wherein the feedback circuit is adapted to provide a voltage in order to force a substantially constant voltage or current at the input pin of the DUT, and
 switching means for alternatively providing a second input of the driver circuit with a voltage V1 or the output of the feedback circuit,
 with the following steps:
 in a first mode switching the switching means for providing the driver circuit with the output of the feedback circuit for receiving the voltage provided by the feedback circuit for forcing a defined voltage at the input pin of the DUT, and
 in a second mode switching the switching means for providing the first voltage V1 to the driver circuit for driving said input data to input pin of the DUT.

10. A software program or product, embodied on a computer readable medium, for executing the method of claim 9, when run on a data processing system.

* * * * *